United States Patent [19]
Limberg

[11] Patent Number: 5,901,175
[45] Date of Patent: May 4, 1999

[54] DYNAMICALLY ADAPTIVE EQUALIZER SYSTEM AND METHOD

[75] Inventor: Allen LeRoy Limberg, Vienna, Va.

[73] Assignee: Samsung Electronics Co., Ltd., Kyungki-do, Rep. of Korea

[21] Appl. No.: 08/832,674

[22] Filed: Apr. 4, 1997

Related U.S. Application Data

[60] Provisional application No. 60/015,003, Apr. 8, 1996.

[51] Int. Cl.$^6$ ....................................................... H03H 7/30
[52] U.S. Cl. ................. 375/232; 364/724.2; 364/724.17; 364/724.19
[58] Field of Search ........................... 364/724.2, 724.17, 364/724.19; 375/346, 348, 350, 232

[56] References Cited

U.S. PATENT DOCUMENTS

| | | | |
|---|---|---|---|
| 5,392,315 | 2/1995 | Laud | 375/14 |
| 5,416,799 | 5/1995 | Currivan et al. | 375/232 |
| 5,440,583 | 8/1995 | Koike | 375/233 |
| 5,563,817 | 10/1996 | Ziegler, Jr. et al. | 364/724.19 |
| 5,659,583 | 8/1997 | Lane | 375/346 |

*Primary Examiner*—Stephen Chin
*Assistant Examiner*—Joseph Roundtree
*Attorney, Agent, or Firm*—Sughrue, Mion, Zinn Macpeak & Seas, PLLC

[57] ABSTRACT

An adaptive filter or equalizer for digital data communication includes, a first cascade circuit connected to operate as a digital finite-impulse-response (FIR) filter, the first cascade circuit having a respective first single input for receiving samples of complex input data, a respective second input composed of a first plurality of input taps for receiving filter weighting signals, and a respective output for producing samples of filtered data. An error signal generator responds to samples supplied from the output of first cascade circuit to generate samples of an error signal. A second cascade circuit, which includes the form of an FIR filter of inverse canonical form, a respective first single input for receiving said delayed samples of complex input data, a respective second input composed of a second plurality of input taps for consecutively receiving said samples of said error signal from error signal generator, a third single input, and a respective output, which supplies samples fed back to the third input for yielding a succession of weighting signals. Storage registers at the inputs of the first and second cascade circuits are updated by weighting signals and by error signal samples, respectively, serving to multiplex application of single inputs to multiple cascade stages.

6 Claims, 3 Drawing Sheets

DYNAMICALLY ADAPTIVE EQUALIZER SYSTEM AND METHOD

CROSS-REFERENCE TO RELATED APPLICATIONS

This application is an application filed under 35 U.S.C. 111(a) claiming pursuant to 35 U.S.C. 119(e)(1) benefit of the filing date of provisional application serial No. 60/015, 003 filed Apr. 8, 1996, pursuant to 35 U.S.C. 111(b).

FIELD OF THE INVENTION

This invention relates to adaptive equalizers using digital sampling and computation processes to effect equalization of transmission lines, or to remove signal distortion owing to variable and multiple paths in radio transmissions carrying digital voice, data and other signals.

BACKGROUND OF THE INVENTION

Adaptive equalizers are used in modem electrical communication to equalize (i.e., compensate for) linear amplitude and phase distortions which naturally tend to occur within the useful frequency band of practical transmission circuits. If these distortions are compensated, as is well known in the art, a given circuit is capable of correctly receiving transmission of information at substantially higher rates and over virtually unlimited transmission distances. In particular, the current invention relates to dynamically adaptive equalizers, which employ the signals transmitted through a communication circuit or channel for measurement of its distortion. Such circuits alter their amplitude and phase characteristics with time to minimize the measured error at the receiving end of the circuit. Adaptive equalizers are required for use in connection with circuits the distortion properties of which are unknown at the time transmission is initiated, or which for any reason may change during transmission. Representative circuits include those having variable multiple paths, radio transmissions carrying digital voice, data and other signals, and switched telephone lines. In typical adaptive equalizer operation, communication may be established using a repeated signal carrying no information. The equalizer adjusts rapidly to compensate for the transmission circuit distortion. After information transmission is begun, the information signals are then used continuously for iterative dynamic correction of the filter characteristics.

Digitally operating adaptive equalizers are well known in the electrical communications art. All equalizers are, basically considered, electrical filters; and adaptive equalizers are based on electrically adaptable filters, typically taking the form of finite impulse response filters, some forms of which are described by Watanabe in U.S. Pat. No. 4,771,395 issued Sep. 13, 1988 and entitled FIR Digital Filter.

In addition to an dynamically adaptable electrical filter, an adaptive equalizer requires a means to produce the series of control inputs (termed "weights") which define the filtered output in time when responding to a single input pulse of known amplitude. This means is conventionally referred to as a "weight generator", and its outputs as "weights", though they are actually measures of the response of the filter to a pulse input supplied at evenly spaced time intervals.

The weight generator, in turn, uses as its input an error signal which is derived by comparing the output of the filter with expected value(s) of the output. Since these circuits are used in digital data transmission, the desired output signals have a very limited number of values.

Some prior art adaptive equalizers use identical circuits for the FIR filter and weight generator (WG) functions. An example of such adaptive equalizer is found in the Mobile Link 1/2 Receiver Program (MLRP) receiver, a product of Stanford Telecommunications, Inc., of Sunnyvale Calif., which uses the Zoran 891 FIR filter chip for both the FIR and weight generator functions of its adaptive equalizer. The Zoran chip is second-sourced by Harris as the HSP43891 and employs the canonical structure, which utilizes output weighting.

Currivan and Ohlson in U.S. Pat. No. 5,416,799 issued May 16, 1995 and entitled Dynamically Adaptive Equalizer System and Method describe the use of the inverse canonical structure, which employs input weighting, for the FIR filter and weight generator functions. A stated objective of their invention is to provide an adaptive digital filter (equalizer) the design of which makes use of similar inverse canonical structure circuits for the digital elements of the greatest complexity, i.e. the FIR filter and the weight generator. The practical benefits are reduced design time and reduced production cost for the equalizer. These benefits apply to adaptive filters having both filter and weight generator on a single semiconductor chip, as well as to adaptive filters in which filter and weight generator comprise separate chips or collections of chips and other components. Another stated objective of their invention is to minimize the number of additional integrated circuits required ("glue chips") to construct a family of adaptive equalizers from a multiplicity of integrated circuits of the same design. Another objective of their invention is to employ low-cost integrated digital circuits capable of operation at significantly higher speeds than are required to handle information signals, and through multiplex use of their outputs achieve significant reduction in cost and complexity of an adaptive filter for those information signals.

To secure their objectives Currivan and Ohlson rely on a weight generator that in effect reverses the direction of time for data samples. As a result, the updating of filter weights in an FIR filter with inverse canonical structure is done by Currivan and Ohlson in such order that error signals are generated from kernels that are only partially updated.

Laud in U.S. Pat. No. 5,392,315 issued Feb. 21, 1995 and entitled FIR Filter Coefficient Updating System points out that it is desirable to update the filter weights in an FIR filter with inverse canonical structure in such order that error signals are generated from kernels that are completely updated. To implement such updating of filter weights, a weight generator is required which operates on principles different from those known to the prior art.

SUMMARY OF THE INVENTION

An adaptive filter or equalizer embodying the current invention includes a first cascade circuit which may be configured in the inverse canonical form (see FIG. 1) connected to operate as a digital finite-impulse-response filter, the first cascade circuit having a respective first single input for receiving samples of complex input data, a respective second input composed of a first plurality of input taps for receiving filter weighting signals, and a respective output for producing samples of filtered data, from which error signal samples are derived. The adaptive filter or equalizer includes a second cascade circuit configured in the inverse canonical form (see FIG. 1) and having a respective first single input for receiving said delayed samples of said complex input data, a respective second input composed of a second plurality of input taps for consecutively receiving said samples of said error signal from said error signal generator, a third single input, and a respective output. The samples from the output of the second cascade circuit are fed back to its third input, to produce an infinite-impulse-response (IIR) filter configuration that generates a succession of filter weighting signals for application to the first plurality of input taps for the second input of the first cascade circuit. Storage registers at the inputs of the first and second cascade circuits are updated by weighting and error signals, respectively, serving to multiplex application of single inputs to multiple cascade stages.

BRIEF DESCRIPTION IF THE DRAWING

DESCRIPTION OF THE PREFERRED EMBODIMENTS

Figure 1:
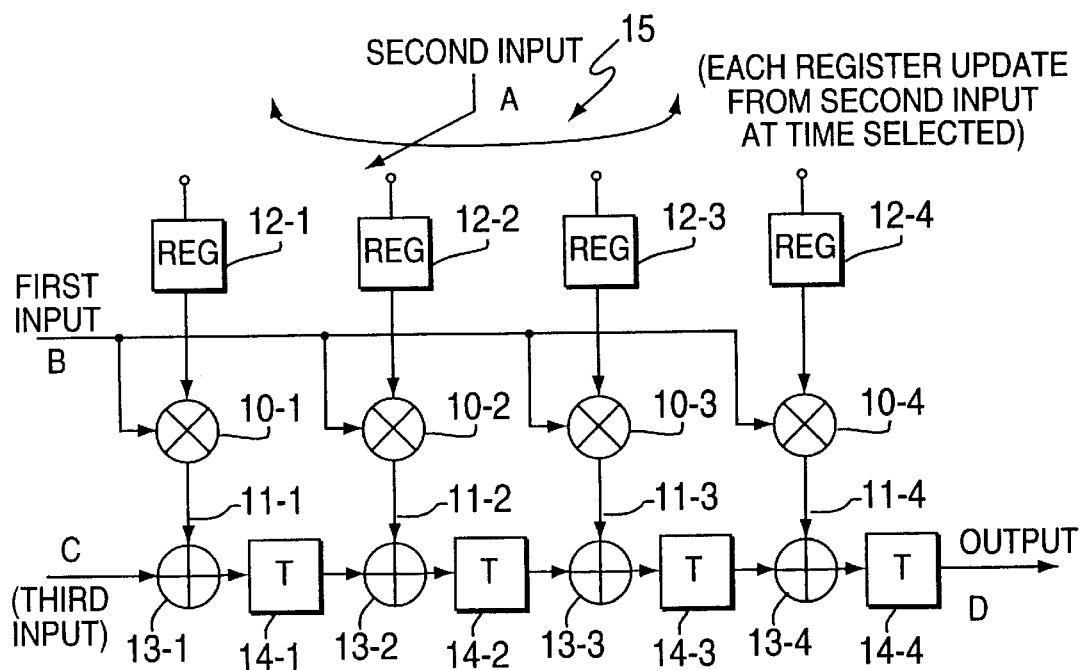
FIG. 1 depicts a representative form of the prior-art configurable circuit, including a configuration referred to as the "inverse canonical form", used as a basis both for the FIR filter and for the associated weight generator.

The inverse canonical form of a FIR filter, or "input-weighted" FIR filter, is defined by the structure in FIG. 1 exclusive of the input switch 15. It includes a group of N taps. (N may be any integer greater than or equal to 1; in the example of FIG. 1, N=4). Each tap (e.g., the leftmost tap in FIG. 1) consists of a multiplier (e.g., 10-1), an adder (e.g., 13-1), a tap delay element (e.g., 14-1), and a coefficient register (e.g., 12-1). The plurality of N taps is cascaded as shown in FIG. 1.

At each clock time, processing occurs in a given tap in the following sequence:

i. The content of the coefficient register is multiplied by the first input B.

ii. The resulting product is added to the left-hand input of the adder. (In the case of the leftmost tap, the left-hand input is the third input C; in the case of the other taps, the left-hand input is the current content of the tap delay element of the neighboring tap to the left.)

iii. The content of the tap delay element is replaced with the output of the adder.

In addition, FIG. 1 contains an input switch 15 the purpose of which is to apply data to the coefficient registers 12-1, 12-2, 12-3, 12-4. On each clock, the switch wiper advances by one tap in its assigned direction (which may be left or right, depending on the mode of operation). When the wiper addresses a given coefficient register, the content of that coefficient register is updated with new information from the second input A. The coefficient registers not being currently addressed hold their previous values. In this manner one coefficient register is updated per clock, and after every period of N clocks all of the coefficient registers have received an update.

FIG. 1 depicts a single electronic circuit suited for either filter or weight generator application. Although the example shown includes N=four cascaded stages, it should be understood that any suitable multiplicity of stages could be used. All signals in FIGS. 1–5 are complex numbers, consisting of a real part and an imaginary part, although the imaginary part of the data may nominally be of zero value. In the case of high-definition television (HDTV) signals, the imaginary part of the data will nominally be of zero value for vestigial sideband amplitude-modulation transmissions; quadrature-amplitude-modulation (QAM) transmissions of HDTV signals will have both real and imaginary components.

The central elements of the circuit include a plurality of digital multipliers 10-1, 10-2, 10-3, 10-4, the outputs connections 11-1, 11-2, 11-3, 11-4 from which supply complex products of a first signal input B and a set of complex numeric values derived from corresponding ones of a like-numbered plurality of storage registers 12-1, 12-2, 12-3, 12-4. The multipliers 10-1, 10-2, 10-3, 10-4 may be implemented in a variety of ways, for example using either fully parallel-by-digit binary operation (equivalent to look-up in a multiplication table stored in read-only memory), serial bit-by-bit multiplication, or any other logically correct signed integer multiplication logic. The product generated by each multiplier forms one input to a respective complex digital adder 13-1, 13-2, 13-3 and 13-4, the other input of which is derived from the adder to its left, but delayed one clock cycle by a respective one of conventional one-sample delay circuits 14-1, 14-2, 14-3 and 14-4, one-sample delay being shown as $\tau$. The delayed output of the right-most adder 13-4 forms the output of the circuit.

A common application of such filters is in connection with the detection of phase- and amplitude-modulated signals. In this case, each of the inputs and weight values shown is a time series of pairs of values, one representing the in-phase or real component (I) and the other the quadrature or imaginary component (Q) of the complex baseband representation of a signal. Hence, each register in fact comprises a pair of registers (one for the I and the other for the Q value). Likewise the adder comprises two adders and the multiplier comprises four multipliers plus two adders, to correctly combine the in-phase and quadrature terms. The technique works equally well with real-number-valued signals.

Digital numeric values stored in the registers 12-1, 12-2, 12-3, 12-4, are derived from the electronic switch 15, shown schematically in the figures. The electronic switch connects input A to one of the storage registers 12-1, 12-2, 12-3, 12-4 during each clock cycle, at which time input A updates the value stored in that register. Between clock pulses, the switch 15 advances to left or right one register. After advancing to the left or right end of the series of registers, the switch next moves to the register at the opposite end to continue its cycle. The direction of advance of switch 15 is arranged to be electronically controlled, as for example by application of a voltage to a controlling terminal or by multiplexer logic circuits (not shown).

It is to be understood that each storage register 12-1, 12-2, 12-3, 12-4 may be designed to store a complex number having up to some selected number of bits, and that multipliers 10-1, 10-2, 10-3, 10-4 and the adders 13-1, 13-2, 13-3, 13-4 are designed to deal with corresponding numbers of bits. As an example, the complex multipliers 10-1, 10-2, 10-3, 10-4 each consist of four real multipliers, with each real multiplier designed to combine pairs of 8-bit inputs into 16-bit products, and the adders 13-1, 13-2, 13-3, 13-4 are designed to hold output values with up to twenty bits for each part (real and imaginary).

Figure 3:
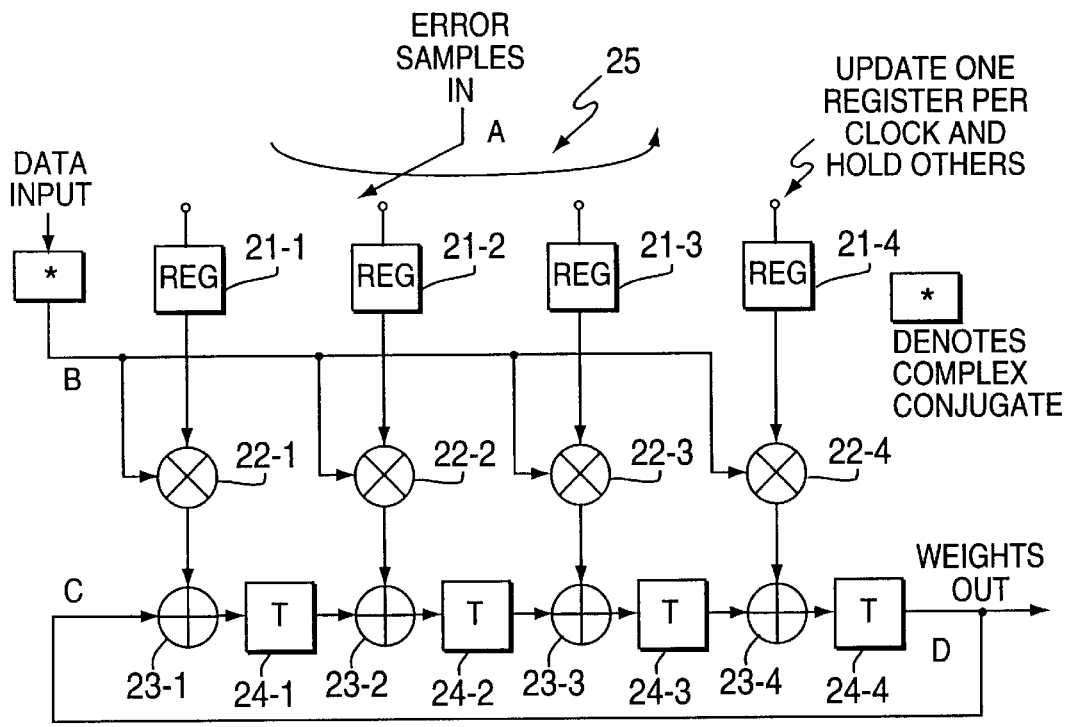
FIG. 3 depicts a weight generator configuration of the general form shown in FIG. 1, as used in the equalizer of the present invention.
Figure 4:
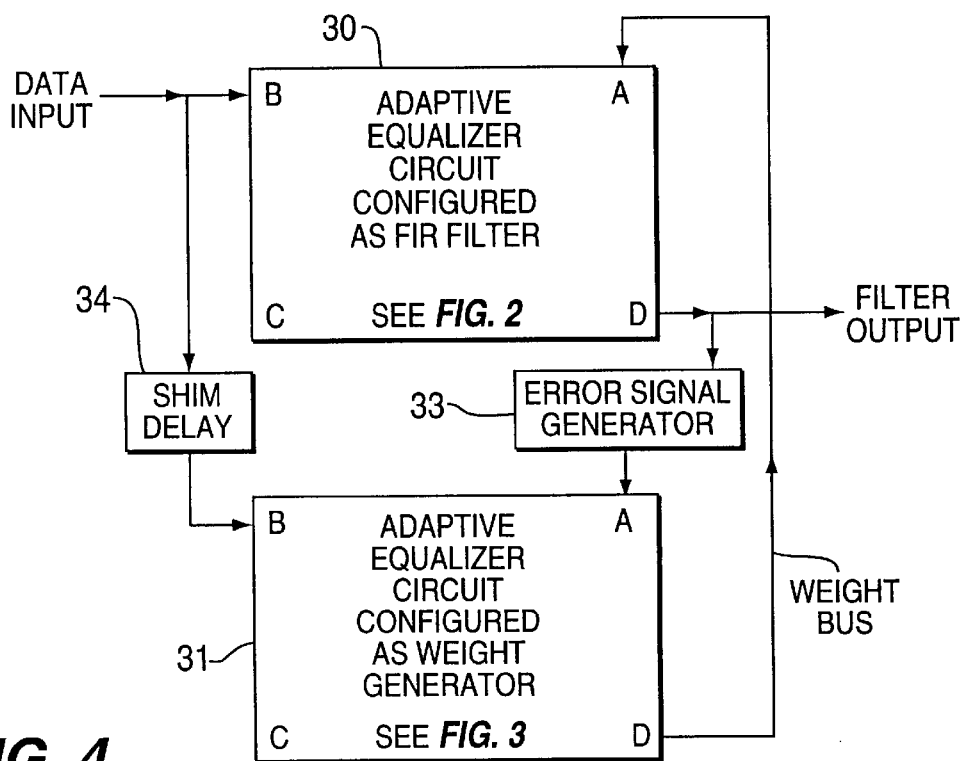
FIG. 4 depicts the interconnection of the circuits of FIGS. 2 and 3 to form an adaptive equalizer embodying the present invention.

A third input C is used when the circuit is connected to another to extend the number of filter taps, as in the example depicted in FIG. 4, and when the circuit is used as a weight generator, as shown in FIG. 3. Otherwise, a wired arithmetic zero is usually applied to this third input C.

Conventional digital clock pulses, generated in a circuit external to those shown, are used to control and sequence the operations of the circuitry. Although by the convention used in the diagrams, for clarity of disclosure, no clock input is shown, each storage register in the circuit receives common clock pulses. Likewise, each part of the circuit is energized by electric power, supplied by an external power supply which is omitted in the diagram convention used for clarity of disclosure.

Figure 2:
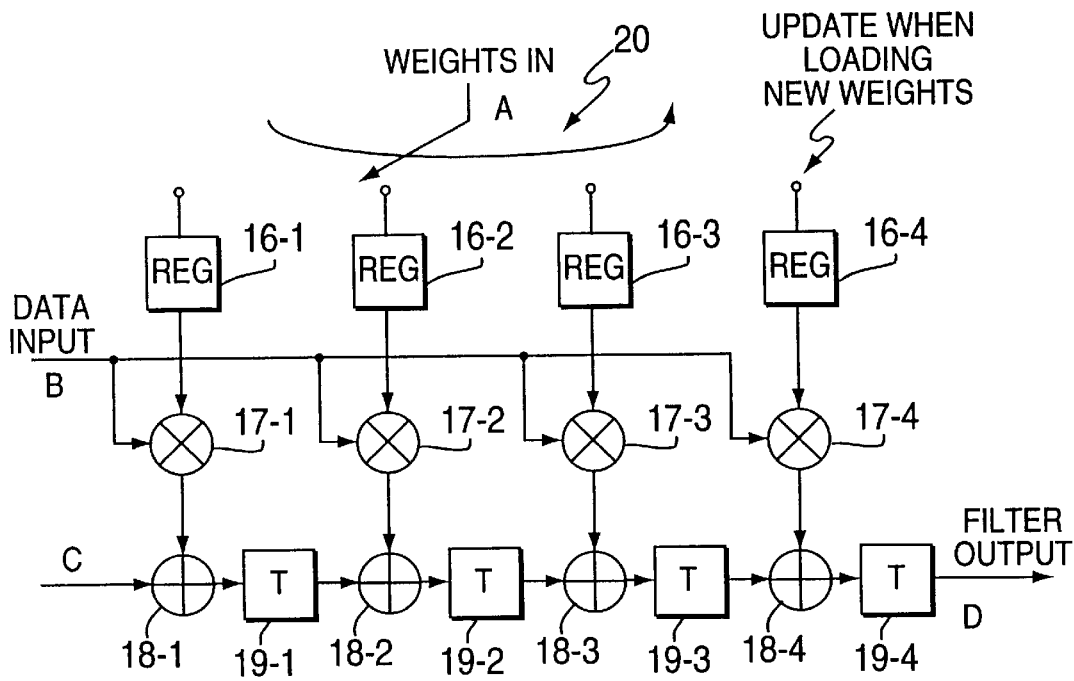
FIG. 2 depicts an adaptive FIR filter configuration of the general form shown in FIG. 1, as used in the equalizer of the present invention.

In the FIR filter configuration of FIG. 2, the signal input B comprises the input data signal, a succession of complex integer digital values, which may for example be derived by sampling an analog input signal for each clock pulse. The second input A, in this case, is a sequence of weighting values, which update the value in each register 16-1, 16-2, 16-3 and 16-4 in turn, sequencing left-to-right in this configuration. The FIR filter configuration of FIG. 2 differs in this regard from that used by Currivan and Ohlson in which the updating of the values in registers 16-1, 16-2, 16-3 and 16-4 is done in opposite order, sequencing right-to-left. Complex digital multipliers 17-1, 17-2, 17-3 and 17-4 multiply the values in the registers 16-1, 16-2, 16-3 and 16-4 by the current input datum to generate products applied as first summands to complex digital adders 18-1, 18-2, 18-3 and 18-4. The sum output signals of the adders 18-1, 18-2, 18-3 and 18-4 are temporarily stored one clock period in registers 19-1, 19-2, 19-3 and 19-4. The contents of the registers 19-1, 19-2 and 19-3 are supplied to the adders 18-1, 18-2 and 18-3 as their second summands, and the content of the register 19-4 supplies to FIR filter response at output connection D. A switch wiper 20 is shown for updating the value in each register 16-1, 16-2, 16-3 and 16-4 in turn.

The FIG. 2 circuit convolves input data samples with a filter kernel defined by weighting signals, to carries out the function of an FIR filter. The output $y_n$ of this FIR filter at time sample (i.e., clock pulse) n, is given by $$y_n = \sum_{i=0}^{n-i} w_i x_{n-1}$$

where $x_n$=filter input at time sample n,
$y_n$=filter output at time sample n,
$w_i$=$i^{th}$ tap weight [i=0, 1, 2, . . . , N–1], and
N=number of tap weights (e.g., four in the example depicted).

Each of the values $x_n$, $y_n$, and $w_i$ comprises in-phase and quadrature components, which are combined according to the rules of combination of complex numbers. In particular, the in-phase component of a sum is the sum of the in-phase components, and likewise for the quadrature components. The in-phase component of a product is the product of the in-phase components less the product of the quadrature components. The quadrature component of a product is the product of the first in-phase and second quadrature components, plus the product of the second in-phase and first quadrature components.

FIG. 3 illustrates the same general circuit shown in FIG. 1 configured to convolve complex conjugates of input data with error samples, thus to operate as a weight generator for use in an adaptive filter. In contrast to the Currivan and Ohlson weight generator, the first input B receives the input data, as subjected to complex conjugation (usually within the connections of complex digital multipliers 22-1, 22-2, 22-3 and 22-4), and the plurality of input taps of the second cascade circuit sequentially receive error signals received by the second input A. Configuration for this application requires that the second input, used to update each register 21-1, 21-2, 21-3 and 21-4 in turn, sequence left-to-right in this configuration., so that each of the N weights is correctly updated by the data received via input B. In addition, the output of the adder chain is fed back to its input C, in this case. The correct increments (differences from the weight value at the previous sample time) for weight generator outputs at sample time n are products of the detected error at time sample n and the conjugated input data values at samples n, n+1, . . . , n+N–1, as given by the expression $$\Delta w_{i,n} = e_n x_{n-i}^*$$

where $\Delta w_{i,n}$=increment of $i^{th}$ tap weight [i=0, 1, 2, . . . , N–1] at sample time n,
*=denotes complex conjugate operation,
$e_n$=error input at sample time n, and
$x_n$=data input at sample time n.

This equation shows that the weight increment at each tap differs from the weight increments at the other taps primarily in the delay i that is applied between the error sequence and the conjugated data sequence. The weights are continuously circulate in a clockwise direction around the feedback loop formed by connecting the output D to the third input C as shown in FIG. 3. As each weight moves to the right through the tap delay registers 24-1, 24-2, 24-3 and 24-4, it is incremented in complex digital adders 23-1, 23-2, 23-3 and 23-4 by the respective products of the current conjugated datum and error signal samples then residing in the error register 21-1, 21-2, 21-3 and 21-4, which products are generated by the complex digital multipliers 22-1, 22-2, 22-3 and 22-4. In order to maintain the correct delay between error and conjugate data for a given weight, the switch wiper 25 at the top of FIG. 3 must move in the same direction as the weights, that is, left-to-right.

As each weight circulates, it appears periodically at the output D, at which time it is available for application to the FIR filter as an updated weight. Since the switch wiper 25 in FIG. 3 progresses in the same direction as the input conjugate data, but at one-quarter the sample rate, weights corresponding to less delay between error and data are generated following weights corresponding to more delay between error and data.

In the FIR structure of FIG. 2, the tap delay register at the right 16-4 corresponds to the input data with least (one unit time τ) delay from input to output, and the tap delay register at the left 16-1 corresponds to the input data with greatest (four unit times τ) delay from input to output. In applying the updated weights to the FIR filter, the weight corresponding to least delay between error and data (the first weight output from the weight generator) is applied to the FIR filter tap with least delay from input to output (the rightmost tap 16-4). Similarly, the weight corresponding to the greatest delay between error and data (the last weight output from the weight generator) is applied to the FIR filter tap with the greatest delay from input to output (the leftmost tap 16-1). Thus in the FIG. 2 FIR filter the switch wiper 20 moves from left-to-right, which is the same direction of motion as the switch wiper 25 in the FIG. 3 weight generator. The incremental tap weight values are combined with the sum of previous increments by the adders 18-1, 18-2, 18-3 and 18-4, such that the output tap weight for tap i at time sample in is given by $$w_{i,n} = \sum_{k=0}^{n} e_k x_{k-1}^*.$$

The internal or external connection of the output D of the weight generator circuit back to its input C, as shown in FIG. 3, circulates the weights through the shift register formed by the adders 23-1, 23-2, 23-3 and 23-4 and delays 24-1, 24-2, 24-3 and 24-4, so the weights are incrementally updated continually in that circulation process. The timing of the application of updated weights to the registers 16-1, 16-2, 16-3 and 16-4 in the FIR filter configuration of FIG. 2 is done sequencing left-to-right, rather than right-to-left as done by Currivan and Ohlson. Surprisingly, the application of the input data samples (as already conjugated or to be conjugated) to the first input B of the second cascade circuit and the application of successive error signals to the second plurality of input taps in by the second input A of the second cascade circuit results in the weights being supplied from the output D in the correct timing for sequential application to the registers 16-1, 16-2, 16-3 and 16-4 in recited order.

FIG. 4 depicts the connection of an FIR filter 30 per FIG. 2 and a weight generator 31 per FIG. 3 to form an adaptive equalizer embodying the invention by connecting the weight output (D) of the weight generator configured circuit to input A of the filter-configured circuit. Input data are derived from signal detection circuits in a conventional manner. The data samples enter input B of the FIR filter 30, are filtered using the latest set of weights, and then output on port D. The weights are loaded into input A of the FIR filter 30 at a rate of one weight per clock. Input C of the FIR filter 30 is tied off to zero. The FIR filter 30 response is analyzed in a conventional manner in error generation circuitry 33 to determine the errors in that response.

When using the adaptive equalizer of the current invention in digital high-definition television receivers, the error signal generator 33 can take forms similar to those described in allowed U.S. patent application Ser. No. 08/216,936 filed Mar. 24, 1994, entitled Rapid-Update Adaptive Channel-Equalization Filtering for Digital Radio Receivers, such As HDTV Receivers and incorporated herein by reference. This application filed for Jian Yang, Chandrakant Bhailabhai Patel, Tianmin Liu and Allen LeRoy Limberg is assigned to Samsung Electronics Co., Ltd., pursuant to employee patent agreements in force at the time the inventions were made.

The errors enter input A of weight generator 31 and are correlated with the data samples, as delayed by clocked delay line 34 for application to input B and thereafter conjugated internally, to produce updated weights which exit the weight generator 31 on port D. The clocked delay line 34 provides shim delay that delays the input data samples so that they can be correlated with the error signals they give rise to, taking into account the latencies in the FIR filter 30 and in the error generation circuitry 33. In contrast to the Currivan and Ohlson weight generator, the registers 21-1, 21-2, 21-3 and 21-4 in the FIG. 3 weight generator 31 provide temporary storage to error signals, rather than providing temporary storage (and attendant delay) to input data samples. Port D of the weight generator is also then tied around to input C internally for the weight accumulation function. The error generation and other auxiliary functions are performed externally.

Figure 5:
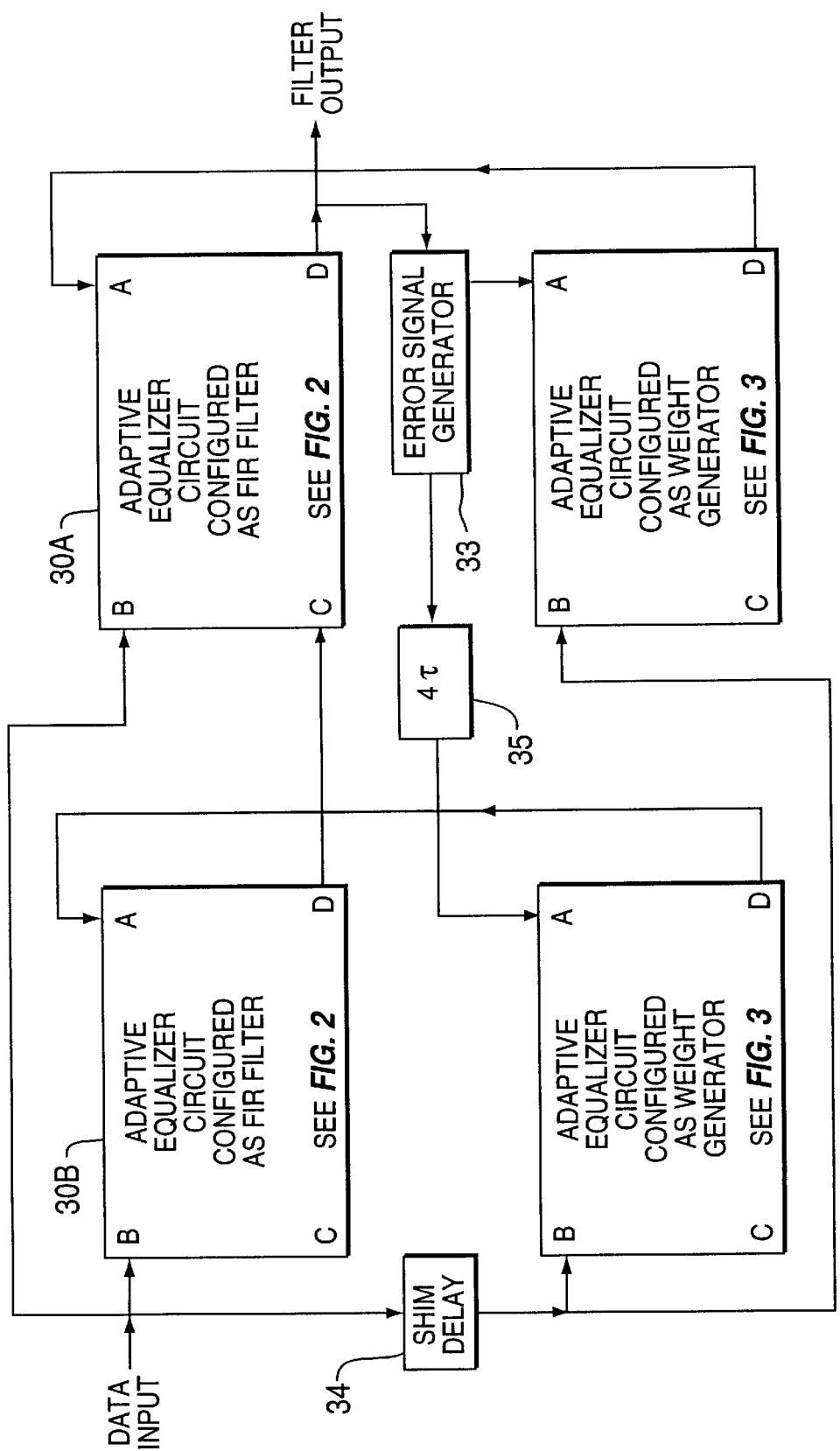
FIG. 5 depicts interconnection of two pairs of FIG. 4 circuits to form an adaptive equalizer with doubled number of filter elements, which is an alternative embodiment of the present invention.

FIG. 5 depicts the connection of four of the same circuits to form an adaptive equalizer having double the number of taps as that in FIG. 4. In this case, the output D of the FIR filter circuit 30B on the left is connected to the C input of the corresponding FIR filter circuit 30A on the right; and input data are applied to the first B inputs of each of the FIR filter circuits 30A, 30B. Cascading of FIR filter circuits in a like manner can occur for any length. Delayed input data are supplied from the clocked delay line 34 to the first B inputs of each of the weight generators 31A, 31B. The error signal samples from the error signal generator 33 are applied to the rightmost weight generator circuit 31A without added delay. Each weight generator circuit cascaded leftward receives error signal samples from the error signal generator 33 delayed by four additional clocks (4τ) in a clocked delay line, such as the clocked delay line 35 that FIG. 5 shows for delaying the error signal samples from the error signal generator 33 four clocks (4τ) for application to the second input A of the weight generator circuit 31B.

While the description above describes a particular class of applications, the invention is applicable to any adaptive filter, equalizer or other electrical filter application in which the uncorrupted and undistorted signal has a format from which can be derived an error signal the reduction to zero of which represents the removal of corruption and distortion.

What is claimed is:

1. An adaptive equalizer comprising:

a first cascade circuit connected to operate as a digital finite-impulse-response filter for complex input data, said first cascade circuit having a respective first single input for receiving samples of complex input data, a respective second input composed of a first plurality of input taps for receiving filter weighting signals, and a respective output for producing samples of filtered data;

an error signal generator for generating samples of error signal responsive to said samples of said filtered data;

a second cascade circuit, said second cascade circuit being a digital finite-impulse-response filter of inverse canonical form for the complex conjugates of delayed samples of said complex input data and having a respective first single input for receiving said delayed samples of said complex input data, a respective second input composed of a second plurality of input taps for consecutively receiving said samples of said error signal from said error signal generator, a third single input, and a respective output;

a feedback connection from the output of said second cascade circuit to its third input connecting said second cascade circuit as an infinite-impulse-response filter to function as a weighting signal generator for said first cascade circuit for yielding a succession of weighting signals from the output of said second cascade circuit, and switch means connecting the succession of weighting signals from said second cascade circuit to successive ones of said first plurality of input taps.

2. The adaptive equalizer defined in claim 1 further including a first set of storage registers connected to said first plurality of input taps and a second set of storage registers connected to said second plurality of input taps for storing filter weighting signals and error signal samples, respectively, the stored filter weighting signals and error signal samples being updated by the weighting signals and the samples of said error signal, respectively.

3. An equalization process to compensate for amplitude and phase distortions in a digital communication channel, comprising:

providing a first cascade circuit connected to operate as a digital finite-impulse-response filter, said first cascade circuit having a respective first single input for receiving samples of complex input data, a respective second input composed of a first plurality of input taps for receiving filter weighting signals, and a respective output for producing filtered data;

generating samples of an error signal from said filtered data, providing a second cascade circuit having the form of a digital finite-impulse-response filter of inverse canonical structure, with a respective first single input being connected for receiving complex conjugate samples of input data, with a respective second input composed of a second plurality of input taps being connected for receiving samples of the error signal, with a respective third single input, and with a respective output;

feeding samples from the output of said second cascade circuit to the third single input of said second cascade circuit, for causing the output of said second cascade circuit to supply a succession of filter weighting signals; and applying said succession of filter weighting signals to the first plurality of input taps of said first cascade circuit, such that said second cascade circuit functions as a weighting signal generator for said first cascade circuit.

4. The equalization process defined in claim 3 including the further steps of:

providing a first plurality of storage registers at said first plurality of input taps in said first cascade circuit for temporarily storing filter weighting signals, providing a second plurality of storage registers at said second plurality of input taps in said second cascade circuit for temporarily storing samples of error signals, updating said first plurality of storage registers from the output of said first cascade circuit, and updating said second plurality of storage registers with the samples of said error signal generated from said filtered data.

5. In combination:

a digital finite-impulse-response filter having a respective first single input for receiving samples of complex input data, a respective second input selectively connected to successive ones of a first plurality N in number of registers for temporarily storing respective weighting signals, and a respective output for producing samples of filtered data by convolving said complex input data with a kernel defined by said weighting signals;

an error signal generator for generating samples of error signal responsive to said samples of said filtered data; and a weighting signal generator comprising:

a second plurality N in number of registers for temporarily storing respective ones of the last N samples of error signal;

a first plurality N in number of complex digital multipliers for multiplying each successive complex conjugate of said complex input data by the contents of a respective one of said second plurality of registers to generate respective products;

a first plurality N in number of clocked latches for temporarily storing respective input signals thereof for supplying respective output signals thereof; and a first plurality N in number of complex digital adders receiving as first summands respective ones of the products from said first plurality of multipliers, receiving as second summands the output signals of respective ones of said first plurality of clocked latches, and summing their respective first and second summands to generate respective sum output signals applied to respective ones of said first plurality of clocked latches as input signals, the output signal of one of said first plurality of clocked latches supplying said weighting signals to said digital finite-impulse-response filter.

6. The combination of claim 5 wherein said digital finite-impulse-response filter includes:

a second plurality N in number of complex digital multipliers for multiplying each successive one of said complex input data by the contents of a respective one of said first plurality of registers to generate respective products;

a second plurality N in number of clocked latches for temporarily storing respective input signals thereof for supplying respective output signals thereof, a first of said second plurality N in number of clocked latches having the product from a first of said second plurality N in number of complex digital multipliers applied thereto as input signal; and a second plurality N−1 in number of complex digital adders receiving as first summands respective ones of the products from other than the first of said second plurality of multipliers, receiving as second summands the output signals of respective ones of said second plurality of clocked latches, and summing their respective first and second summands to generate respective sum output signals one of which sum output signals is composed of said samples of said filtered data and the others of which sum output signals are applied to respective ones of said second plurality of clocked latches as input signals.

* * * * *